United States Patent
Raszka et al.

(10) Patent No.: US 7,184,346 B1
(45) Date of Patent: Feb. 27, 2007

(54) MEMORY CELL SENSING WITH LOW NOISE GENERATION

(75) Inventors: Jaroslav Raszka, Fremont, CA (US); Vipin Kumar Tiwari, Fremont, CA (US)

(73) Assignee: Virage Logic Corporation, Fremont, CA (US)

(*) Notice: Subject to any disclaimer, the term of this patent is extended or adjusted under 35 U.S.C. 154(b) by 0 days.

(21) Appl. No.: 11/029,916

(22) Filed: Jan. 4, 2005

Related U.S. Application Data

(62) Division of application No. 10/226,380, filed on Aug. 22, 2002, now Pat. No. 6,850,446.

(60) Provisional application No. 60/340,149, filed on Dec. 6, 2001.

(51) Int. Cl.
- G11C 7/02 (2006.01)
- G11C 14/00 (2006.01)
- G11C 8/00 (2006.01)
- G06F 12/00 (2006.01)
- G06F 17/50 (2006.01)

(52) U.S. Cl. ............ 365/206; 365/185.08; 365/220; 365/230.03; 365/233; 703/13; 703/14; 703/19; 703/21; 703/22; 711/167

(58) Field of Classification Search ......... 365/185.08, 365/206, 207, 233, 233.5; 711/167; 703/13, 703/14, 19, 21, 22
See application file for complete search history.

(56) References Cited

U.S. PATENT DOCUMENTS

| | | | |
|---|---|---|---|
| 4,375,086 A | 2/1983 | Van Velthoven |
| 4,467,457 A | 8/1984 | Iwahashi et al. |
| 4,884,241 A | 11/1989 | Tanaka et al. |
| 4,951,257 A | 8/1990 | Imamiya et al. |
| 4,970,691 A | 11/1990 | Atsumi et al. |
| 5,220,527 A | 6/1993 | Ohsawa |
| 5,251,171 A | 10/1993 | Yamauchi |
| 5,267,214 A | 11/1993 | Fujishima et al. |
| 5,299,162 A | 3/1994 | Kim et al. |
| 5,331,597 A | 7/1994 | Tanaka |
| 5,430,670 A | 7/1995 | Rosenthal |

(Continued)

OTHER PUBLICATIONS

McPartland et al., "1.25 Volt, Low Cost, Embedded FLASH Memory for Low Density Applications", 2000 Symposium on VLSI Circuits Digest of Technical Papers, pp. 158-161.

(Continued)

*Primary Examiner*—Amir Zarabian
*Assistant Examiner*—Ly Duy Pham
(74) *Attorney, Agent, or Firm*—Blakely, Sokoloff, Taylor & Zafman, LLP

(57) ABSTRACT

Various methods, apparatuses and systems in which a memory uses a noise reduction circuit to sense groups of memory cells. The memory has a plurality of memory cells organized into groups of memory cells. The noise reduction circuit performs a sense operation on a first group of memory cells at the substantially the same time. The noise reduction circuit performs a sense operation on a second group of memory cells at substantially the same time. The noise reduction circuit has timing circuitry to sense the second group of memory cells after the sense of the first group initiates but prior to the completion of the sense operation on the first group of memory cells.

20 Claims, 10 Drawing Sheets

U.S. PATENT DOCUMENTS

| | | | |
|---|---|---|---|
| 5,668,752 A | 9/1997 | Hashimoto | |
| 5,732,022 A | 3/1998 | Kato et al. | |
| 5,761,121 A | 6/1998 | Chang | |
| 5,768,186 A | 6/1998 | Ma | |
| 5,781,489 A | 7/1998 | Okamoto | |
| 5,793,694 A | 8/1998 | Akiba et al. | |
| 5,801,076 A | 9/1998 | Ghneim et al. | |
| 5,805,013 A | 9/1998 | Ghneim et al. | |
| 5,808,953 A | 9/1998 | Kim et al. | |
| 5,854,114 A | 12/1998 | Li et al. | |
| 5,885,870 A | 3/1999 | Maiti et al. | |
| 5,973,975 A | 10/1999 | Raad | |
| 6,018,477 A | 1/2000 | Wang | |
| 6,061,273 A * | 5/2000 | Pascucci | 365/185.25 |
| 6,064,105 A | 5/2000 | Li et al. | |
| 6,069,382 A | 5/2000 | Rahim | |
| 6,084,820 A | 7/2000 | Raszka | |
| 6,094,394 A | 7/2000 | La Rosa | |
| 6,144,230 A | 11/2000 | Kim | |
| 6,324,097 B1 | 11/2001 | Chen et al. | |
| 6,330,186 B2 | 12/2001 | Tanaka | |
| 6,337,808 B1 | 1/2002 | Forbes | |
| 6,374,205 B1 * | 4/2002 | Kuribayashi et al. | 703/14 |
| 6,392,957 B1 | 5/2002 | Shubat et al. | |
| 6,407,946 B2 | 6/2002 | Maruyama et al. | |
| 6,407,956 B2 | 6/2002 | Ooishi | |
| 6,417,728 B1 | 7/2002 | Baschirotto et al. | |
| 6,438,051 B1 | 8/2002 | Fifield et al. | |
| 6,445,614 B1 | 9/2002 | Tsai et al. | |
| 6,473,356 B1 | 10/2002 | Raszka | |
| 6,597,626 B2 | 7/2003 | Hirabayashi | |
| 6,597,629 B1 | 7/2003 | Raszka et al. | |
| 6,741,497 B2 * | 5/2004 | Roohparvar et al. | 365/185.08 |
| 6,788,574 B1 | 9/2004 | Han et al. | |
| 6,842,375 B1 | 1/2005 | Raszka | |
| 6,850,446 B1 | 2/2005 | Raszka et al. | |
| 6,992,938 B1 | 1/2006 | Shubat et al. | |
| 2001/0026474 A1 * | 10/2001 | Fujima et al. | 365/189.01 |
| 2002/0095560 A1 * | 7/2002 | Barth et al. | 711/169 |

OTHER PUBLICATIONS

Simon J. Lovett, "The Nonvolatile Cell Hidden in Standard CMOS Logic Technologies", IEEE Transactions on Electron Devices, vol. 48, No. 5, May 2001, pp. 1017-1018.

Ohsaki et al., "A Single Polysilicon Wafer EEPROM Cell Structure for Use in Standard CMOS Processes", IEEE Journal of Solid-State Circuits, vol. 29*, No. 3, Mar. 1994, pp. 311-316.

* cited by examiner

MEMORY CELL SENSING WITH LOW NOISE GENERATION

RELATED APPLICATIONS

This application is a divisional of, and claims priority from, U.S. patent application Ser. No. 10/226,380, filed on Aug. 22, 2002, which has now issued as U.S. Pat. No. 6,850,446, and claims the benefit of the file date of U.S. Provisional Patent Application Serial No. 60/340,149, filed Dec. 6, 2001.

FIELD OF THE INVENTION

Embodiments of the invention generally relate to a memory. More particularly, one or more embodiments of the invention relate to a memory having a timing circuit.

BACKGROUND OF THE INVENTION

A typical architecture of a memory cell may have a charging component, a sensing component, and a storage component. The storage component stores information represented by a given voltage level. The charging component programs and erases information stored in the memory cell. The sense component conveys the information stored in the memory cell during a read operation.

In memory designs where the transistors of multiple memory cells are switching at the same time, the peak current demand goes very high and the power supply may not be able to supply the instant current demand without generating excess noise. In that short period of time when the excess current demand is occurring, the transistors may not function properly. Moreover, the high peak current may induce noise into the memory system or any other block of electronic components sitting near that memory instance. Further, the high peak current may increase the electro migration in the power buses to cause other noise. Thus, when a memory recalls data from a large amount of non-volatile memory cells in parallel to corresponding volatile memory cells a lot of noise may be induced into this memory system.

In prior art system employing flash memories, the reading and writing operating voltages may typically be between 500 millivolts and 1000 millivolts. Generally, all of the flash memory cells are read from or written to as a single group. The noise generated from the single group read or write operations compared to sensing voltages and loading voltages used in the flash memory cell is only a small percentage of the data voltage levels stored in those cells. However, some non-volatile electrically alterable memory cells operate at a significantly lower stored data voltage level. At these lower storing and loading voltages, noise becomes a significant factor in design. Nonetheless, access time and speed to the information stored in these memory cells is also a design factor. In general, a memory should maintain a fast access rate, maintain that the data being transferred is accurate, and ensure that the data corruption by noise levels does not occur.

Some prior art memory systems get around this problem by simply adding a memory that is discrete from a chip, as a stand-alone unit. Some stand-alone memory units, such as a flash memory unit, operate on significantly higher voltages and therefore are not affected by what is commonly called transistor output switching current noise. Therefore, in the current technology of most stand-alone memories, controlling noise levels is not as important because that memory's operating voltages are significantly larger. However, these stand-alone memory units add an extra component into a design of a system, which then adds in extra cost. Some of these memory units may also be embedded into a System On a Chip design, however, that task creates multiple extra processing steps beyond what occurs in a standard fabrication logic process. The extra processing steps add more costs into making the System on a Chip.

SUMMARY OF THE INVENTION

Various methods, apparatuses and systems in which a memory uses a noise reduction circuit to sense groups of memory cells. The memory has a plurality of memory cells organized into groups of memory cells. The noise reduction circuit performs a sense operation on a first group of memory cells at the substantially the same time. The noise reduction circuit performs a sense operation on a second group of memory cells at substantially the same time. The noise reduction circuit has timing circuitry to sense the second group of memory cells after the sense of the first group initiates but prior to the completion of the sense operation on the first group of memory cells.

BRIEF DESCRIPTION OF THE DRAWINGS

The drawings refer to embodiments of the invention in which.

Figure 1:
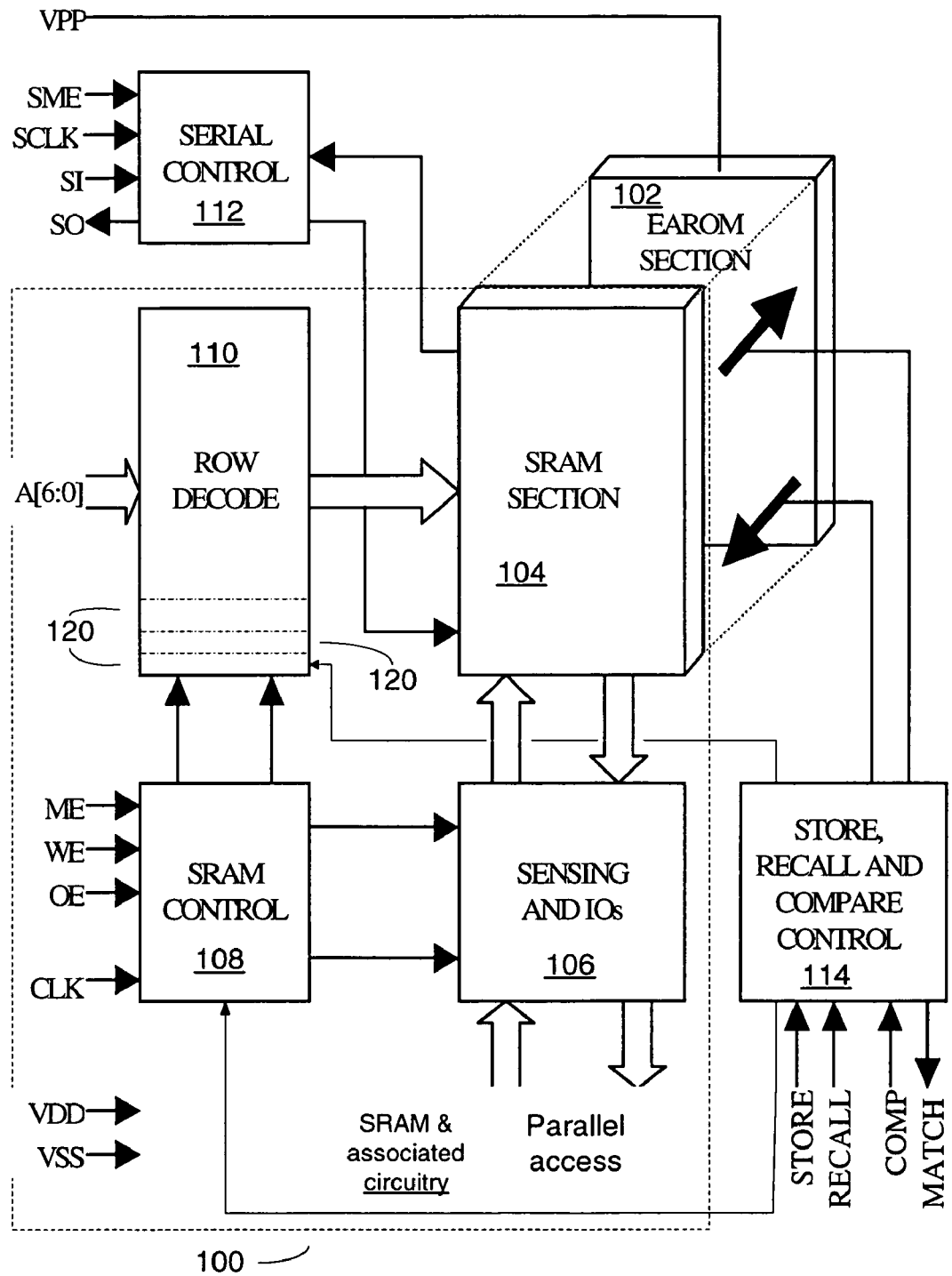
FIG. 1 illustrates a block diagram of an embodiment of a memory array having a non-volatile memory cooperating with a volatile memory to store, recall, and compare binary data.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DESCRIPTION OF THE INVENTION

In the following description, numerous specific details are set forth, such as examples of specific data signals, named components, connections, arrangement of components, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Further specific numeric references, such as a first timing circuit, may be made. However, the specific numeric reference should not be interpreted as a literal sequential order but rather interpreted that the first timing circuit is different than a second timing circuit. Thus, the specific details set forth are merely exemplary. The specific details may be varied from and still be contemplated to be within the spirit and scope of the present invention.

Various methods, apparatuses and systems are described in which a memory uses a noise reduction circuit to sense groups of memory cells. The memory has a plurality of memory cells organized into groups of memory cells. The noise reduction circuit performs a sense operation on a first group of memory cells at the substantially the same time. The noise reduction circuit performs a sense operation on a second group of memory cells at substantially the same time. The noise reduction circuit includes timing circuitry to sense the second group of memory cells after the sense operation on the first group initiates.

FIG. 1 illustrates a block diagram of an embodiment of a memory array having a non-volatile memory cooperating with a volatile memory to store, recall, and compare binary data. In an embodiment, the memory array 100 may consist of a non-volatile memory 102, such as an electrically alterable ROM section, a volatile memory 104, such as a SRAM section, and the circuitry associated with the volatile memory 104, such as a sensing and I/O block 106, a SRAM control block 108 and a row decoder block 110. The memory instance 100 may also contain a serial control block 112, and a sensing control circuit 114.

The sensing control circuit 114 connects to the non-volatile memory 102 as well as the volatile memory 104. The sense control circuit 114 contains circuitry to send a control signal to store data from the volatile memory section 104 into the non-volatile memory section 102, to recall data from the non-volatile section 102 into the volatile memory section 104, and/or to compare the data stored in the non-volatile memory section 102 to the data stored in the volatile memory section 104. The comparison may be a parity check such that the data is checked in each non-volatile memory cell and corresponding volatile memory cell.

In an embodiment, the volatile memory section 104 and the non-volatile memory section 102 cooperate by linking a non-volatile memory cell to store data from a volatile memory cell and vice versa. Volatile memories, such as SRAM, are generally much faster at being accessed when reading and writing data to that memory than non-volatile memories. However, volatile memories lose the data they store when the power is removed. Thus, to combine the benefits of fast access times for data stored in a volatile memory and in order to allow data to be stored even when power is removed from a component, volatile and non-volatile memories may be designed to cooperate together. The data stored in the non-volatile memory section 102 is transferred to the volatile memory section 104 in order to have access to the data in a faster manner. Some of the data permanently stored in the non-volatile memory 102 may be information such as a password or other information files that should not be readily accessed or changeable.

In an embodiment when a store occurs data is transferred in parallel from the volatile memory 104 into the non-volatile memory cells. Similarly, when a recall operation occurs data is transferred in parallel from the memory cells in the non-volatile memory 102 to the volatile memory 104.

The sensing and I/O's block 106 contains components such as input/output circuitry and sense amplifying circuitry to access and perform read and write operations on the volatile memory section 104. Typically, during normal operations parallel access to the volatile memory section 104 occurs through the sensing and I/O's block 106.

The row decoder section 110 decodes memory addresses that are going to be read from or written to. The row decoder section 110 may call up the addresses for individual memory cells and groups of memory cells. In an embodiment a group of memory cells may be, for example, all the memory cells in a specific row or a specific column. The row decoder section 110 contains one or more a timing reference circuits 120 coupled to the memories 102, 104 to direct a sense operation on each group of memory cells. The sense operations being successively run on each group of memory cells in order to moderate noise generated by the peak transistor switching current caused by each sense operation. In an embodiment, a component similar to the timing reference circuits 120 to moderate noise generation can be located in another block such as the sensing and I/O's block 106.

The sense control circuitry 114 may also send, for example, a general recall signal or a general store signal, to the timing reference circuitry 120 located in the row decoder circuitry 110 to initiate the sensing operations.

The timing reference circuitry 120 couples to the non-volatile memory 102 and volatile memory 104 arrays to expose a first group of memory cells to the sense voltage timed so that the first group of memory cells is read all at the same time. In an embodiment, the first group of memory cells is read in parallel. Next, the timing reference circuitry 120 exposes a second group of memory cells to the sense voltage. The timing reference circuitry 120 continues to expose groups of memory cells until a given sense request is complete.

In an embodiment, a single timing reference circuit 120 may exist in the row decoder circuit 110 to service all of the non-volatile memory cells. In an embodiment, one or more timing reference circuits 120 may exist in the row decoder circuitry 110 to provide access to each group of memory cells. In an embodiment, each group of memory cells has its own individual timing reference circuit 121.

In an embodiment, each individual timing reference circuit 121 may consist of three discrete circuits. A sense mimic circuit to mimic the cell structure and/or the sense time period of the group of non-volatile memory cells coupled to that timing reference circuit. A load mimic circuit to mimic the load time of how long it will take the group of volatile memory cells to load the data from the group of non-volatile memory cells. Last, a control signal circuit generates a control signal to control the time that the actual group of non-volatile group of memory cells is exposed to the sense voltage.

In an embodiment, the sense control circuitry 114 can sense recall voltages in a range of 20 to 500 millivolts in order to sense the recall data for all the bits accessed in parallel from the non-volatile memory 102.

The serial control circuitry 112 may be used for testing of the memory. All the memory cells in both the volatile and the non-volatile memory sections 102, 104 are typically checked to detect errors associated with the memory cells. The serial control circuitry 112 allows all of the data to be serially read out of the volatile memory section 104 with a single control signal. The data in the non-volatile memory 102 may be sensed in groups in order to transfer its data to the volatile memory 104. The data content of the volatile memory 104 such as 128 kilobytes, 32 kilobytes, 18 kilobytes, etc. may be transferred serially with one control signal to a component external or internal to the memory array 100.

By cooperating the non-volatile memory section 102 to the volatile memory section 104, the test time, the time it takes to test for all the bad cells, improves dramatically. In some cases, ten different tests are performed on each memory cell to determine if a bad cell exists or not. The test time improves dramatically because the sensed data is sent in groups from the non-volatile memory section 102 in parallel and then accessed and read from the volatile memory section 104 all at one time serially using the faster access time associated with volatile memory cells. Typically, the access time to a volatile memory cell may be in the nanoseconds whereas access time for reading/writing operations in a non-volatile memory cell may be in the milliseconds. Thus, the time to convey the information from the test is based on, for example, ten accesses to the volatile memory 104 rather than ten accesses to non-volatile memory 102.

In an embodiment, the non-volatile memory cells in the non-volatile memory 102 may be electrically alterable non-volatile memory cells. Moreover, one or more of the non-volatile memory cells may be a NOVEA memory cell from Virage Logic located in Fremont, Calif. In an embodiment, the standard reading and writing voltages are in a range of 400 millivolts to 20 millivolts for the NOVEA memory cell. Note, this is in contrast to the flash memory cells that typically use between 1000 and 2000 millivolts for reading and writing operations. In an embodiment, the architecture memory includes a static random access memory (SRAM) section overlaid bit-for-bit with the nonvolatile electrically alterable read only memory (EAROM).

Figure 2:
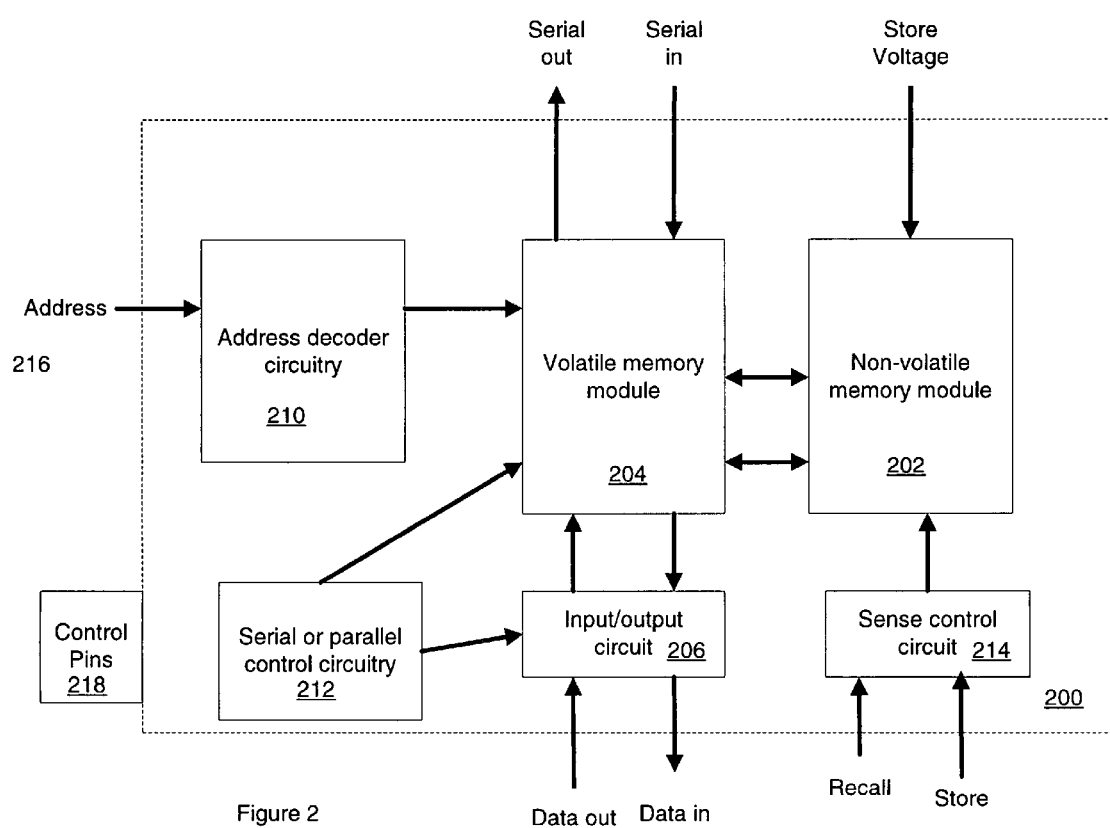
FIG. 2 illustrates a block diagram of an embodiment of the memory instance during a store or recall operation.

In an embodiment, the non-volatile memory cell and the corresponding volatile memory cell may be discrete components. In an embodiment, the volatile memory cell and its corresponding non-volatile memory cell may be combined into a single cell structure. In an embodiment, the electrically-alterable non-volatile memory cells data storage voltage is 400 millivolts or less FIG. 2 illustrates a block diagram of an embodiment of the memory instance during a store or recall operation. The exemplary memory instance 200 contains similar components as that in FIG. 1. The memory instance contains a sense control circuit 214, a non-volatile memory 202, a volatile memory 204, input/output circuitry 206 coupled to the volatile memory 204, address decoder circuitry 210 coupled to the volatile memory 204, and a serial or parallel control circuitry 212. The serial or parallel control circuitry 212 determines whether the data will be transferred serially out of the volatile memory 204 or whether the data will be accessed during read and write operations in parallel, such as during an individual word line being read from or written to.

The memory instance 200 also consists of address pins 216 and control pins 218. The sense control circuitry 214 sends a recall signal to the non-volatile memory 202. The non-volatile memory 202 then sends the data for the first group of memory cells all in parallel to the volatile memory 204. The non-volatile memory 202 then sends the data for the second group of memory cells all in parallel to the volatile memory 204. The non-volatile memory 202 may continue to send data from groups of memory cells from the non-volatile memory 202 to the volatile memory 204 until the entire content of the non-volatile memory 202 has been transferred. The volatile memory 204 after receiving the serial control signal from the serial parallel control circuitry may send the data serially out to a testing component in order to check and verify the reliability of the memory cells in both the non-volatile and volatile memories 202, 204.

Figure 3:
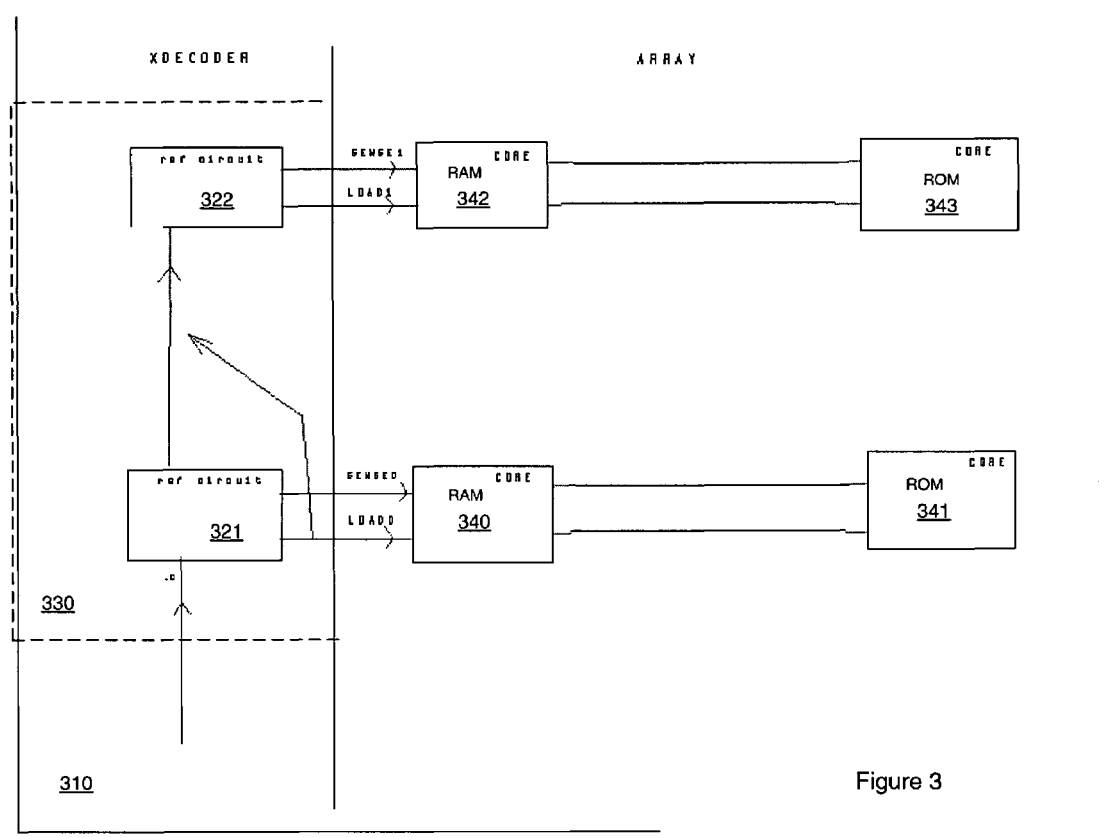
FIG. 3 illustrates a block diagram of an embodiment of a plurality of individual timing reference circuits wherein each circuit is coupled to a group of memory cells.

FIG. 3 illustrates a block diagram of an embodiment of noise reduction circuit containing a plurality of individual timing reference circuits that are each coupled to a group of memory cells. The decoder circuitry 310 may contain a noise reduction circuit 330 to sense groups of memory cells. The noise reduction circuit 330 may contain two or more individual timing reference circuits including a first individual timing reference circuit 321 and a second individual timing reference circuit 322 daisy chained to the first individual timing reference circuit 321.

The first individual timing reference 321 may receive a plurality of signals, including a general recall signal, from the sensing control circuit. The first individual timing reference circuit 321 sends a sense signal as well as a load signal to the first group of volatile memory cells 340 coupled to that circuit and the first group of non-volatile memory cells 341 coupled to that circuit.

All the data is transferred from the first group non-volatile memory cells 341 to the volatile memory cells 340 in parallel. The non-volatile memory cells may operate and store data typically with a range of 400 to 20 millivolts to represent the stored binary data. In an embodiment, amplifiers may exist to increase the operating load and store voltages stored in the volatile memory cells. When the data is transferred from the first group non-volatile memory cells 341 to the first group of volatile memory cells 340 both the noise generation is maintained at acceptable levels and the sensing time that the first group of non-volatile memory cells 341 are exposed to the sensing voltage is kept to a minimum in order to reduce the sense disturbed. In an embodiment, the amount of memory cells to include in a group of memory cells and still maintain noise generation within acceptable levels may be determined through empirical methods.

As noted above, each individual timing reference circuit further uses a timing technique to turn on one group of memory cells that has a tolerable amount of noise to not corrupt the data being transferred from the non-volatile memory into the volatile memory cells before starting the reading of the next group of memory cells.

Also, in an embodiment, the sense circuit 321, 322, may sense recall voltages using a Small Sensing Voltage to discern the recall data for all of the bits in a first group of non-volatile memory cells in the non-volatile memory. In standard memory cells, the voltage level of the sense voltage is approximately the same as the voltage level of the power supply. However, another type of memory cell may use a tunneling mechanism to inject a stored charge into the memory cell. The injected millivolt charge determines the logic state of that memory cell. The sense circuit 331, 332 may use a Small Sensing Voltage to discern the recall data. One skilled in the art will be familiar with the manner of using a Small sensing voltage to discern the recall data. In an embodiment, the Small Sensing Voltage has a given voltage level and the given voltage level of the Small Sensing Voltage is less than 26% of the power supply voltage level.

The first individual timing reference circuit 321 sends a signal up the daisy chain to the second individual timing reference circuit 322 when the start of the second sense operation should occur. The second individual timing reference circuit 322 then starts initiating its sensing and loading of the memory cells coupled to that timing reference circuit.

In an embodiment, the sense operation on the second group of memory cells 342, 343 occurs after the sense operation on the first group of memory cells 340, 341 initiates but prior to the completion of the sense operation on the first group of memory cells 340, 341. The sense operation on the second group of memory cells 342, 343 occurs after the initial peak current surge due to the sense operation on the first group of memory cells 340, 341. In an embodiment, the timing reference circuit exposes the first group of memory cells 340, 341 to the sense voltage timed so that the start of the second sense operation occurs for the second group of memory cells 342, 343 after the first sense operation is approximately complete. In an embodiment, the timing reference claims may sense the static RAM memory in groups of memory cells as well as sensing the non-volatile memory in groups of memory cells.

Figure 4:
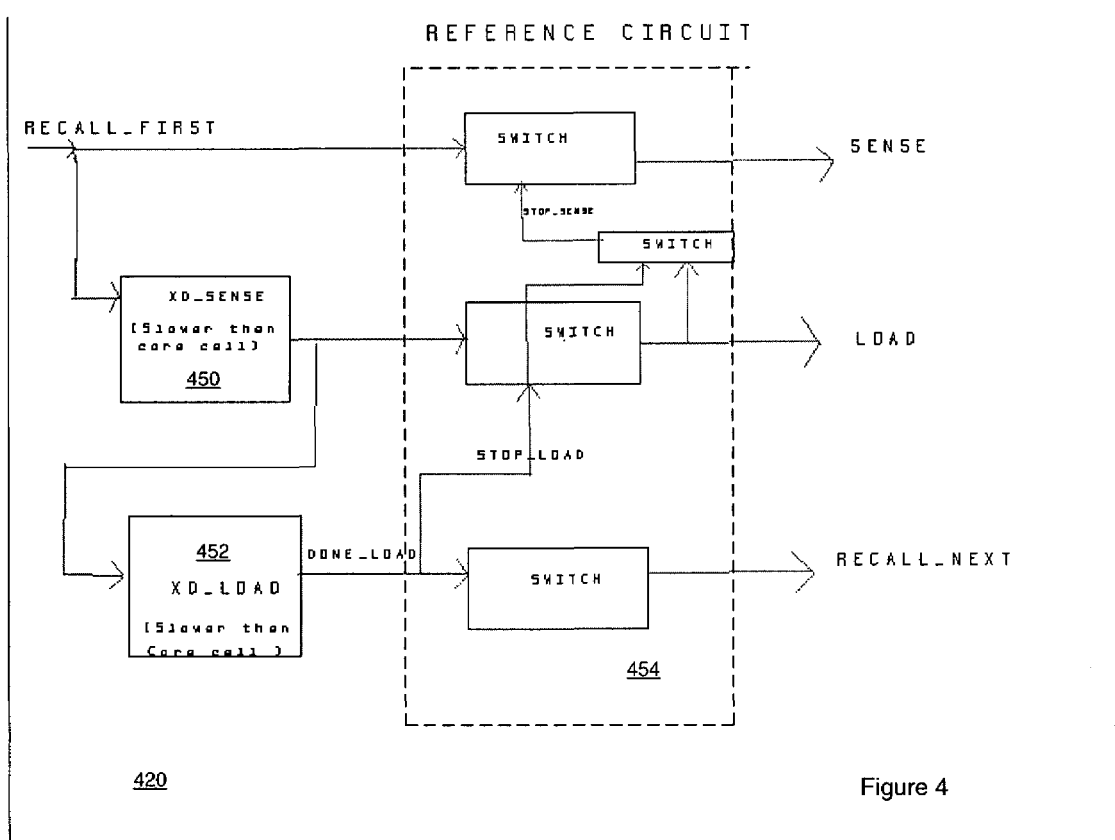
FIG. 4 illustrates a block diagram of an embodiment of an individual timing reference circuit.

FIG. 4 illustrates a block diagram of an embodiment of an individual timing reference circuit. The timing reference circuit 420 may contain sense mimic circuitry 450; load mimic circuitry 452, and a control signal circuit 454.

The sense mimic circuit 450 and the control signal circuit 454 may receive the general recall signal from the sense control circuit. The control signal circuit 454 on receiving the general recall signal may then initiate a first control signal to sense the data stored in the actual group of non-volatile memory cells coupled to the timing reference circuit 420. The sense mimic circuit 450 also responds to the general recall signal by generating a mimicked sensed period of time. The sense mimic circuitry 450 mimics the sense response time of the actual non-volatile memory cells. In an embodiment, the sense mimic circuitry 450 may mimic the actual cell structure or at least the sense response time period possessed by the group of actual non-volatile memory cells. Note however, through design, the mimicked sense response time period could be slightly longer, i.e. slower, response time than the actual core cells that are being mimicked by this sense mimic circuitry 450.

As noted above, two or more non-volatile memory cells may be in the first group of memory cells coupled to this timing reference circuit 420. Thus, the sensed mimic circuit will mimic the time that it should take for all of the non-volatile memory cells to be sensed in parallel as well as then time it takes to convey their information back to the volatile memory cells coupled to those non-volatile memory cells. Therefore, the sensed mimic circuitry 450 generates a sense time response.

The load mimic circuitry 452 monitors the output of that sensed mimic circuitry 450 in order to determine when the sensed time response achieves a certain threshold voltage. When the sensed time response voltage on the output of the sensed mimic circuit 450 achieves a certain threshold voltage, then the corresponding actual non-volatile memory cell should have conveyed its data to the volatile memory cell coupled to the non-volatile memory cell. Thus, for example, the voltage level on a bus connection between the two cells is at an acceptable level to transfer the contents of whatever binary data that the non-volatile memory cell was containing into the volatile memory cell.

The control signal circuit 454 upon sensing the threshold voltage then generates a load pulse to the actual volatile memory cell coupled to the non-volatile memory cell in order to load the data from the non-volatile memory cell into the volatile memory cell.

At approximately the same time, the load mimic circuitry 452 then starts initiating a load pulse in order to determine the load response time of the volatile memory cells storing the sensed data from the first group of non-volatile memory cells. The load mimic circuitry 452 mimics the load response time of the time period it will take for all the bits in the first group of non-volatile memory cells to load into the volatile memory cells. However, by design, the load mimic circuitry could be slightly longer, i.e. slightly slower, load time than for the actual volatile memory cells.

The load mimic circuitry 452 then terminates the load pulse when it indicates that the load operation time period should be complete. The load mimic circuitry 452 then sends a signal to the control signal circuitry 454. The control signal circuitry 454 then sends a control signal to the actual volatile memory cells to stop loading. The control signal circuitry should then receive a signal from the sense mimic circuitry 450 that indicates that the sense operation in the non-volatile memory cell should be complete.

The control signal circuitry 454 now knows that the sense operation in the non-volatile memory cells should be complete and that the load operation in the volatile memory cells should also be complete. The control signal circuitry 454 then internally sends a signal to terminate the sensing operation on the actual non-volatile memory cells in the first group of memory cells. This completes an exemplary way of producing the time limiting process of how long the actual non-volatile memory cells are exposed to the sensing voltage. The timing reference circuit 420 minimizes the amount of potential sense disturb by limiting the amount of time that the actual non-volatile memory cells are exposed to the control pulse/sensing voltage.

Note, sense disturb refers to corruption of the data stored in the actual memory cell. The actual non-volatile memory cells are storing voltages to indicate the information contained within those cells. When the actual non-volatile memory cells are exposed to the sense operation voltage, the voltage stored within those cells may be altered and thus corrupted.

The control signal circuitry 454 may send a signal to the next individual reference timing circuit to initiate a sense and load operation with its associated group of memory cells, when the noise generation from transistor switching due the sensing operation on the first group of memory cells has decreased to an acceptable level to not corrupt data sensed in the associated group of memory cells. The starting and stopping of sensing operations on groups of memory cells may continue until all of the groups of memory cells in the non-volatile memory cells have been sensed and loaded into the corresponding volatile memory cells. After the last group of memory cells has been sensed and loaded, the noise reduction circuit sends a feedback signal to the sensing control circuit to terminate the general recall signal.

The control signal circuitry 454 in each reference timing circuit 400 also controls the rising and falling edges of the above signals in order to make sure that the timing occurs in the proper order.

Figure 5A:
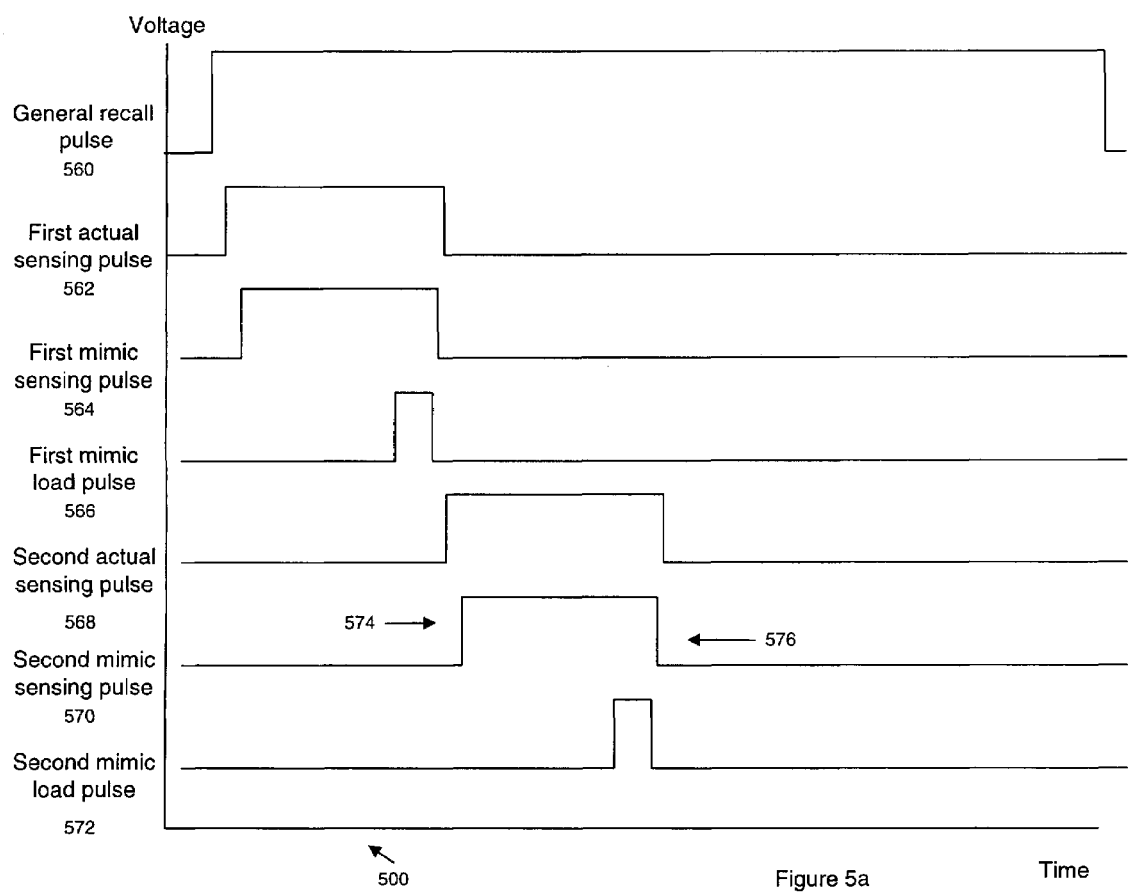
FIGS. 5a and 5b illustrate timing diagrams of embodiments of an operation to sense multiple groups of memory cells.
Figure 5B:
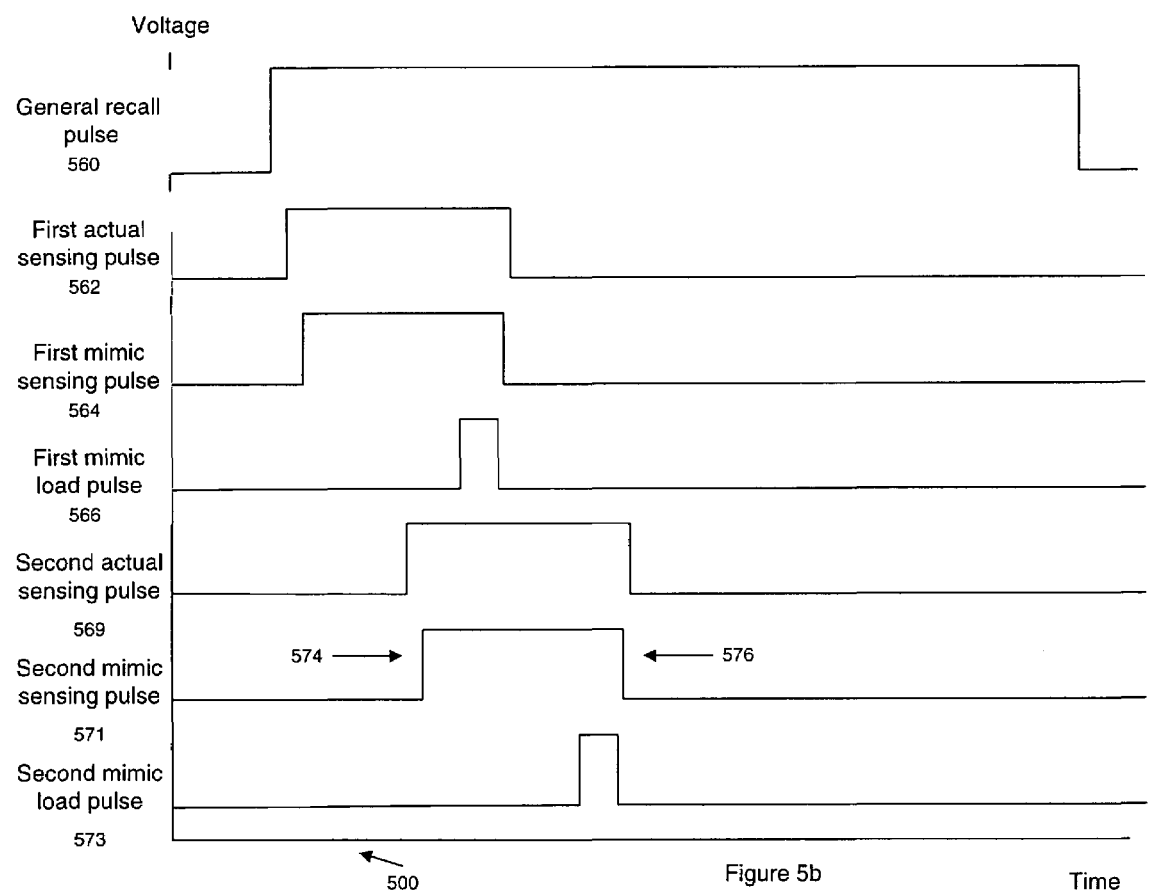

FIG. 5a and 5b illustrate timing diagrams of embodiments of an operation to sense multiple groups of memory cells. FIG. 5a illustrates a timing diagram 500 to expose the first group of memory cells to a sense voltage timed so that a start of the second sense operation 568 occurs for the second group of memory cells after the first sense operation 562 is approximately complete. FIG. 5b illustrates a timing diagram performing a second sense operation 569 on the second group of memory cells after the first sense operation 562 on the first group initiates but prior to the completion of the first sense operation 562 on the first group of memory cells. Both timing diagram illustrate a general recall pulse 560 generated from the sensing and control circuit, a first actual sensing pulse 562 to a first group of memory cells generated by the first control signal circuit, a first mimic sensing pulse 564 generated by the first sense mimic circuitry, a first mimic load pulse 566 generated by the first load mimic circuitry, a second actual sensing pulse 568, 569 generated by the second control circuitry, a second mimic sense pulse 570 571 generated by the second mimic circuitry, and a second mimic load pulse 572, 573 generated by a second load circuitry.

Referring to FIG. 5a and FIG. 5b, the rising edge of the general recall pulse 560 sent to the timing reference circuit initiates the timing of the sensing operations. The control signal circuitry initiates an actual sense pulse 562 to sense data stored in a first group of non-volatile memory cells contained in the memory. The sense mimic circuitry initiates a sense mimic signal 564 to simulate the time it takes to sense all of the non-volatile memory cells in the first group of non-volatile memory cells. The sense mimic circuitry generates the duration of the sense response from the simulated sense time of the non-volatile memory cells. The load mimic circuitry monitors when the sense response achieves a threshold voltage.

The load mimic circuitry initiates a load mimic signal 564 to simulate the time it takes for a load operation in one or more volatile memory cells to load data stored in the first group of non-volatile memory cells after the sense response achieves the threshold voltage. The load mimic circuitry terminates the load mimic signal 564 when the actual load operation is approximately complete. As noted above, the load mimic circuitry generates a simulated load response that is designed to be slightly longer in duration than an actual load operation.

The first sense mimic circuitry terminates the first sense mimic signal 564 after it internal circuitry indicates the time it takes to sense all of the non-volatile memory cells is complete and the load mimic signal has terminated. The control signal circuitry terminates the first actual sense pulse 562 to the first group of actual non-volatile memory cells after the sense mimic signal 564 is terminated.

Referring to FIG. 5a, the control signal circuitry initiates a second actual sense pulse 568 to sense data stored in a second group of non-volatile memory cells contained in the memory approximately when the first actual sense pulse is terminated.

Referring to FIG. 5b, the control signal circuitry initiates a second actual sense pulse 569 to sense data stored in a second group of non-volatile memory cells contained in the memory after the first actual sense pulse 562 is initiated but prior to the completion of the first sense operation 562 on the first group of memory cells.

Referring to FIGS. 5a and 5b, after the control signal circuitry initiates a second actual sense pulse 568, 569 the simulating of the load and sense times repeats again. The starting and stopping of the sensing of the groups of memory cells may continue until all of the groups of memory cells in the non-volatile memory cells have been sensed and loaded into the corresponding volatile memory cells. The sense control circuit terminates the general recall signal 560 after all of the groups of memory of cells in non-volatile memory have been sense and loaded.

Note, simulating the sense and load durations includes hardware mimicking as well as software mimicking. Each pulse may have a falling edge 576 and a rising edge 574. In an embodiment, the actual sense pulse for each group of memory cells may overlap slightly or a gap may exist between the pulses. An approximate range of a fifteen millisecond overlap to a fifteen millisecond gap may exist between the edges of the pulses. In an embodiment, the overlap between the actual sense pulse for each group of memory cells may initiate for the next group of memory cells when the noise generation from the sense operation of the proceeding group of cells will not corrupt data being read from that next group of cells.

Figure 6:
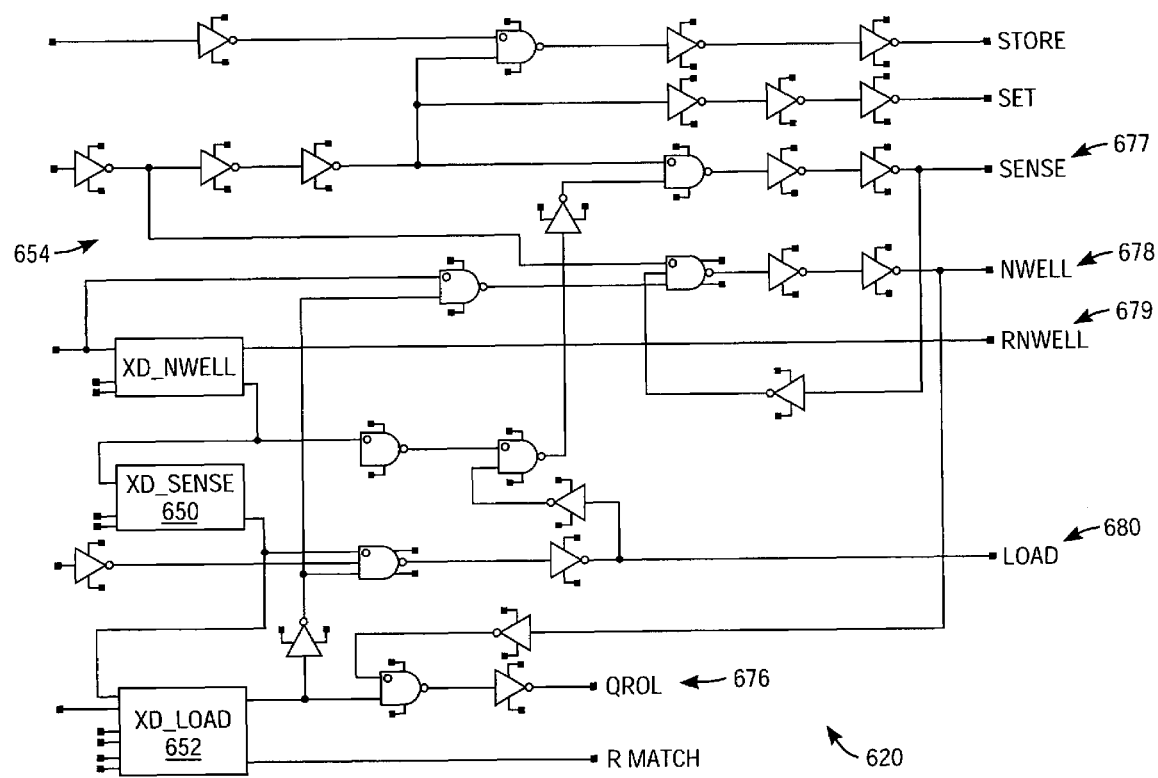
FIG. 6 illustrates an exemplary schematic diagram of an embodiment of an individual timing reference circuit.

FIG. 6 illustrates an exemplary schematic diagram of an embodiment of an individual timing reference circuit. In an embodiment, the individual timing reference circuit 620 may contain the control signal circuitry, the sense mimic circuitry, and the load mimic circuitry. The sense mimic circuitry 650, the load mimic circuitry 652, and the control signal circuitry 654 operate very similar to that described above. The control circuitry 654 receives an input from the general recall pulse, first in line of course receives it from the sensing control circuit and then the following timing reference circuits daisy chain down the line receive their input from the output 676 of the first individual timing reference circuit 620.

The control signal circuit 654 sends a signal throughout the sense node 677, the N-well node 678, and the R Nwell node 679 to the group of non-volatile memory cells. The control signal circuit 654 also sends a signal out the load node 680 to the group of volatile memory cells. The sense mimic circuitry 650 sends a signal to the control signal circuitry 654 as well as its output is monitored by the load mimicking circuitry 652.

In an embodiment, the sense mimic circuitry 650 may be an XD sense circuit. The sense mimic circuit 650 determines the width of the sense pulse. In an embodiment, the load mimic circuitry 652 may be an XD load circuit. The load mimic circuitry 652 determines the width of the load pulse. In an embodiment, the control signal circuitry 654 may be the XD N-well circuit and its associated components. The control signal circuit 654 determines the length of the actual control signal pulse sent to the non-volatile memory cells and the volatile memory cells.

Referring to FIG. 1, the instance of the memory array 100 may be an embedded memory fabricated using a standard logic process. In an embodiment, the instance having this embedded memory of non-volatile memory cells may be fabricated through a standard Complementary Metal Oxide Semiconductor logic process of one micron or less.

Figure 7:
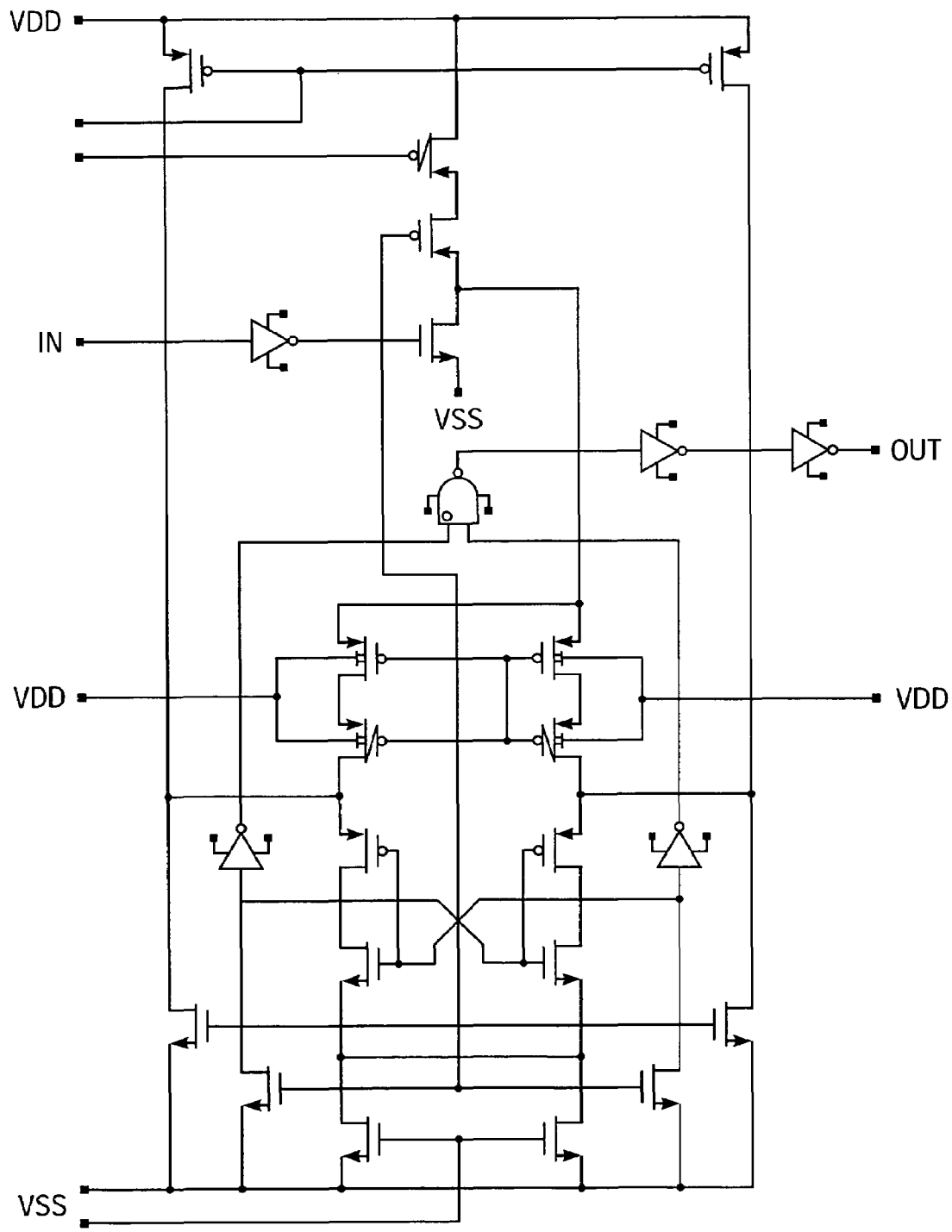
FIG. 7 illustrates an exemplary schematic diagram of a sense mimic circuit.

FIG. 7 illustrates an exemplary schematic diagram of a sense mimic circuit. The sense mimic circuit 750 may be either structurally similar to the group of non-volatile memory cells its trying to mimic the sense time response of, or a completely different structure and just designed to be similar to the response time of the group of non-volatile memory cells its trying to mimic the sense time response of. In an embodiment, the sense response time of this sense mimic circuit 750 is structured to be slightly longer in period of time than the actual non-volatile memory cells that it's representing. In an embodiment, these electronic circuits may be composed of MOS devices, transistors, as well as logic elements such as OR gates, AND gates, NOR gates, XOR gates, etc.

Figure 8:
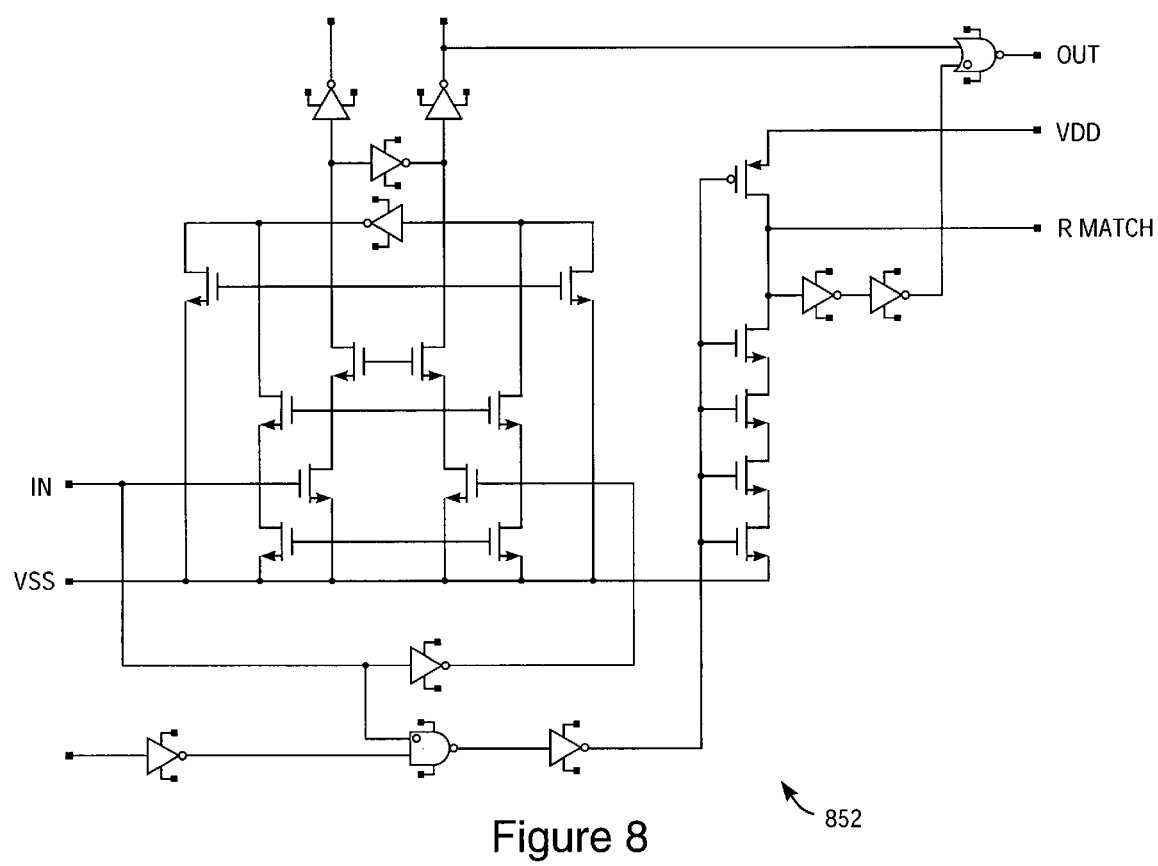
FIG. 8 illustrates an exemplary schematic diagram of an embodiment of a load mimic circuit.

FIG. 8 illustrates an exemplary schematic diagram of an embodiment of a load mimic circuit. The load mimic circuit 852 may structurally resemble the cell structure of the group of volatile memories it is mimicking, or a completely different structure than the load response time it is mimicking. The load mimic circuitry 852 may be composed of various CMOS and NMOS transistors and various Boolean logic components. In an embodiment, when the noise level reaches 50% of the stored data voltage level, then the data sensed or recalled from that memory cell may be corrupted. In an embodiment, recall voltage may also be referred to as read voltage.

Figure 9:
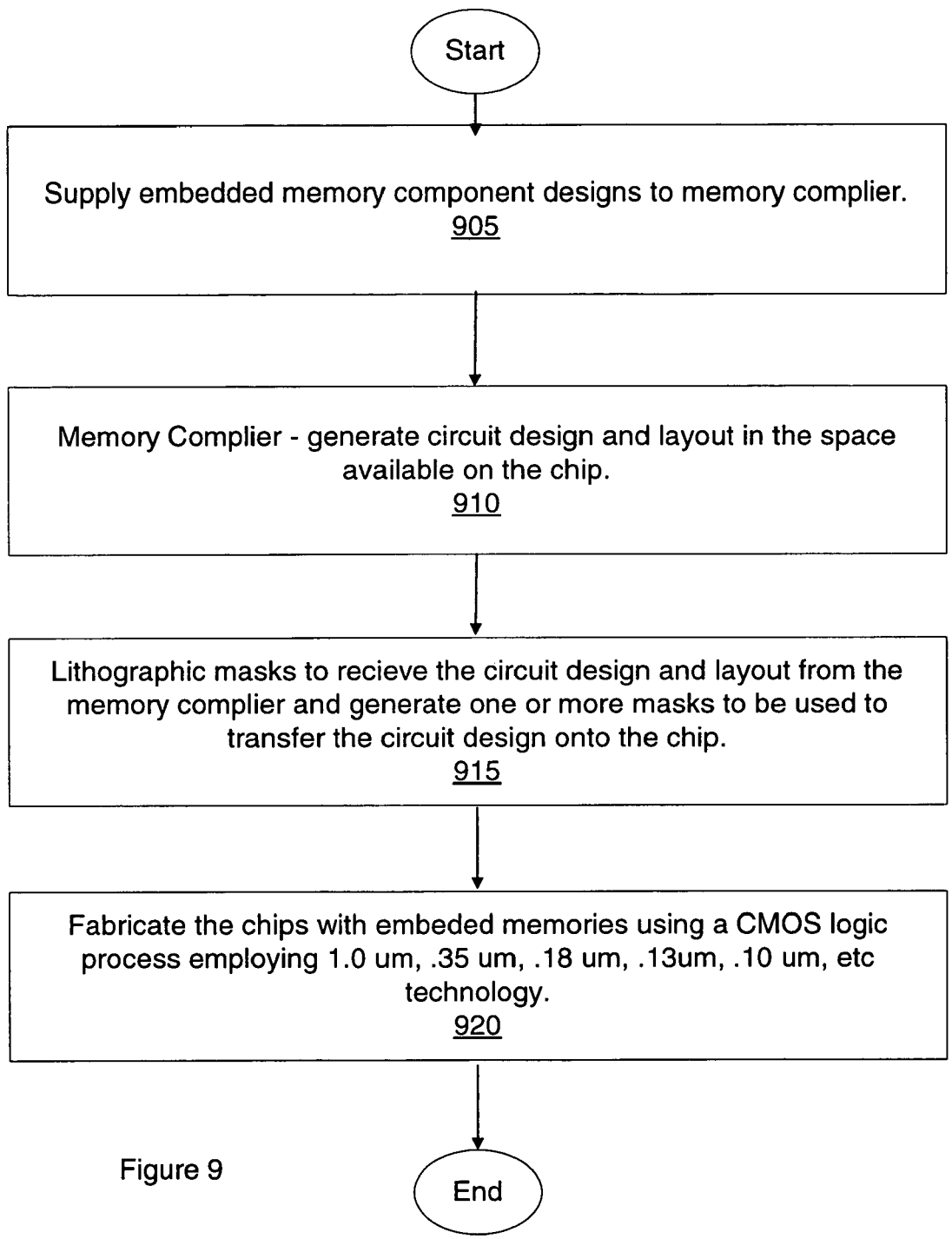
FIG. 9 illustrates a flow diagram of an exemplary process of generating an embedded memory from the memory component designs with a memory compiler.

FIG. 9 illustrates an exemplary process of generating an embedded memory from the memory component designs with a memory compiler.

In block 905, the designs for each memory component for the embedded memory are supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system IC integrators to rapidly create hundreds of silicon-proven memory cores. The memory compiler receives designs of memory component and utilizes those memory component designs in conjunction with memory circuit designs to optimize a circuit design and layout in the space available on a target chip. The memory having a noise reduction circuit may be a basic memory building block utilized in a design for the non-volatile random access memory compiler.

In block 910, the memory compiler generates a circuit design and layout in the space available on a target chip. The memory compiler stores the data representing the embedded memory typically on a machine-readable medium. The memory compiler then provides design to be used to generate one or more lithographic masks to be used in the fabrication of that embedded memory.

In block 915, the machine to generate the lithographic masks receives the circuit design and layout from the memory compiler. The machine generates one or more lithographic masks to be used to transfer that circuit design onto the chip.

In block 920, a fabrication facility fabricates the chips with the embedded memories using the lithographic masks generated from the memory compiler's circuit design and layout. Fabrication facilities may use standard CMOS logic process employing 1.0 um, 0.50 um, 0.35 um, 0.25 um, 0.18 um, 0.13 um, 0.10 um, or less, technologies to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded memory onto the chip itself.

In an embodiment, the embedded memory containing one or more noise reduction circuit can be embedded into the System on Chip. The embedded memories can be fabricated in a state-of-the-art, leading edge standard logic process with no additional process steps or additional special masks. In an embodiment, the memory compiler is designed for embedded applications in the standard CMOS logic process.

In an embodiment, an exemplary memory compiler may also include the following. A graphic user interface, a common set of processing elements, and a library of files containing design elements such as circuits, control logic, and cell arrays that define the compiler. In an embodiment, object code in a set of executable software programs may form one or more of the compiler's function blocks.

As noted, in an embodiment, a designer chooses the specifics of the memory configuration to produce the set of files defining the requested memory instances. A memory instance may include front-end views and back-end files. The front-end views support documentation, simulation, debugging, and testing. The back-end files, such as a layout, physical LEF, etc. are for layout and fabrication.

In one embodiment, the software used to facilitate the compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, electrical, optical, acoustical or other form of propagated signals (e.g., carrier waves, infrared signals, digital signals, EPROMs, EEPROMs, FLASH, magnetic or optical cards, or any type of media suitable for storing electronic instructions. Slower mediums could be cached to a faster, more practical, medium.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or the like, may refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

The nonvolatile random access memory compiler may be designed for embedded applications in the generic TSMC 0.18 um logic process. In an embodiment, no additional special masks or special process steps are required. In an embodiment, the nonvolatile random access memory design allows data to be easily transferred from SRAM to EAROM section (STORE operation) and back from EAROM to SRAM section (RECALL operations). The STORE and RECALL operations work simultaneously with all memory bits. In an embodiment, the STORE operation may be usually completed in less than 300 ms (around 20 us per bit for the largest 16384 bit instance) and the RECALL operation is completed in 10 us or less (around 0.6 ns per bit for the largest 16384 bit instance).

The nonvolatile random access memory may be designed for generally unlimited serial and parallel access to the SRAM section and minimum of 1000 STORE operations to the EAROM. Data retention may be specified to be greater than 10 years in power off state (storage) or idle mode and unlimited in the keep mode. Endurance (data changes per bit) may be specified to be 100 or more.

For applications where low pin count interface is essential a serial access port can be used (SHIFT cycle). During the SHIFT cycle the SRAM section may be reconfigured as a single long shift register and data can be shifted serially in via the serial input (SI) pin and observed on the serial output (SO) pin.

While some specific embodiments of the invention have been shown the invention is not to be limited to these embodiments. For example, most functions performed by electronic hardware components may be duplicated by software emulation. In a different memory architecture, the memory cells sensed in groups may be dynamic random access memory cells, FLASH memory cells, or similar memories. The invention is to be understood as not limited by the specific embodiments described herein, but only by scope of the appended claims.

What is claimed is:

1. A method, comprising:
    sensing data stored in a plurality of groups of non-volatile memory cells contained in an embedded memory, the plurality of groups of non-volatile memory cells including a first group of the non-volatile memory cells;
    simulating the time it takes to sense all of the non-volatile cells in the first group of the non-volatile memory cells;
    simulating the time it takes to load into one or more volatile cells a plurality of data that is being sensed from the first group of non-volatile memory cells; and
    terminating the sensing of the first group after the simulated sense time and the simulated load time indicate that these operations are complete.

2. The method of claim 1, further comprising:
    sensing a second group of memory cells the sense operation on the first group initiates but prior to the completion of the sense operation on the first group of memory cells.

3. The method of claim 2, further comprising:
    sensing a third group of memory cells after the sense operation on the second group initiates but prior to the completion of the sense operation on the second group of memory cells contained in an embedded memory.

4. The method of claim 1, further comprising:
    generating a sense response from the simulated sense time of the non-volatile memory cells;
    monitoring when the sense response achieves a threshold voltage; and
    initiating a signal to simulate the time it takes for the load operation in the first group of non-volatile memory cells after the sense response achieves the threshold voltage.

5. The method of claim 1, wherein
    the first group of non-volatile memory cells is a group of electrically alterable non-volatile memory cells that cooperate with the one or more volatile cells to store and recall data.

6. The method of claim 1,
    wherein a sensing recall voltage of less than four hundred millivolts is used to discern the recall data for all of the bits in the first group of non-volatile memory cells.

7. An apparatus to perform the operations stated in claim 1.

8. A machine readable medium that stores data representing the apparatus of claim 7.

9. The method of claim 8, wherein
    the machine readable medium comprises a memory compiler to provide a design for one or more lithographic masks used in fabrication of an embedded memory.

10. The method of claim 9, wherein
    the design for the one or more lithographic masks are utilized during a standard Complementary Metal Oxide Semiconductor logic process employing equal to or less than one micron technology.

11. The method of claim 8, further comprising:
    sensing all of the memory cells in the first group of non-volatile memory cells in parallel, and
    loading contents of the first group of non-volatile memory cells into corresponding volatile memory cells in parallel.

12. A machine readable storage medium containing instructions, which when executed by the machine, to cause the machine to perform the operations of claim 1.

13. An apparatus, comprising:
    means for sensing data stored in a plurality of groups of non-volatile memory cells contained in an embedded memory, the plurality of groups of non-volatile memory cells including a first group of the non-volatile memory cells;
    means for simulating the time it takes to sense all of the non-volatile cells in the first group of the non-volatile memory cells;
    means for simulating the time it takes to load into one or more volatile cells a plurality of data that is being sensed from the first group of non-volatile memory cells; and
    means for terminating the sensing of the first group after the simulated sense time and the simulated load time indicate that these operations are complete.

14. The apparatus of claim 13, further comprising:
    means for sensing a second group of memory cells after the sense operation on the first group initiates but prior to the completion of the sense operation on the first group of memory cells.

15. The apparatus of claim 14, further comprising:
    means for sensing a third group of memory cells after the sense operation on the second group initiates but prior to the completion of the sense operation on the second group of memory cells contained in an embedded memory.

16. The apparatus of claim 13, further comprising:
    means for generating a sense response from the simulated sense time of the non-volatile memory cells;
    means for monitoring when the sense response achieves a threshold voltage; and
    means for initiating a signal to simulate the time it takes for the load operation in the first group of non-volatile memory cells after the sense response achieves the threshold voltage.

17. The method of claim 13, wherein
    the first group of non-volatile memory cells is a group of electrically alterable non-volatile memory cells that cooperate with the one or more volatile cells to store and recall data.

18. A machine readable medium that stores data representing the apparatus of claim 13.

19. The apparatus of claim 18, wherein the machine readable medium comprises a memory compiler to provide a design for one or more lithographic masks used in fabrication of an embedded memory.

20. The apparatus of claim 19, wherein
the design for the one or more lithographic masks are utilized during a standard Complementary Metal Oxide Semiconductor logic process employing equal to or less than one micron technology.

* * * * *